United States Patent [19]
Asami

[11] Patent Number: 4,904,948
[45] Date of Patent: Feb. 27, 1990

[54] PHASE COMPARATOR CIRCUIT

[75] Inventor: Fumitaka Asami, Kunitachi, Japan

[73] Assignee: Fujitsu Limited, Kawasaki, Japan

[21] Appl. No.: 167,712

[22] Filed: Mar. 14, 1988

[30] Foreign Application Priority Data

Mar. 19, 1987 [JP] Japan ................. 62-062404

[51] Int. Cl.$^4$ ................. H03K 9/06; H03K 5/26
[52] U.S. Cl. ................. 328/133; 328/109; 307/514; 307/479
[58] Field of Search ........... 328/133, 134, 155, 109, 328/55, 110–112; 307/511, 514, 516, 262, 479, 234

[56] References Cited
U.S. PATENT DOCUMENTS

| 3,710,140 | 1/1973 | Volmerange | 328/133 |
| 3,989,931 | 11/1976 | Phillips | 320/134 |
| 4,339,731 | 7/1982 | Adams | 328/133 |
| 4,378,509 | 3/1983 | Hatchett et al. | 307/514 |
| 4,739,278 | 4/1988 | Des Brisay, Jr. et al. | 328/134 |

Primary Examiner—Stanley D. Miller
Assistant Examiner—Timothy P. Callahan
Attorney, Agent, or Firm—Staas & Halsey

[57] ABSTRACT

A phase comparator circuit for comparing a phase of a first input signal with a second input signal and outputting a first output signal and a second output signal in accordance with a result of the comparison, and comprising two flip-flop circuits and a latch circuit, whereby, when the first and second input signals are in-phase, both first and second output signals are output.

5 Claims, 6 Drawing Sheets

PHASE COMPARATOR CIRCUIT

BACKGROUND OF THE INVENTION

1. Field of the Invention

The present invention relates to a phase comparator circuit, more particularly, to a phase comparator circuit for comparing the phases of two input signals and outputting two output signals in accordance with the result of the comparison.

2. Description of the Related Art

A phase comparator circuit, for example, is used in a PLL (phase-locked loop) circuit, which compares the phases of two input signals and outputs two output signals in accordance with a phase difference between the two input signals of the phase comparator circuit. A conventional phase comparator circuit is designed to obtain an ideal characteristic in the two output signals thereof. In this ideal characteristic, when a phase difference occurs between the two input signals, the two output signals are not output, and thus the level of both output signals is made a logical low level.

However, generally speaking, a manufactured conventional phase comparator circuit does not have the above ideal characteristic, due to dispersions of the elements or parts of the phase comparator circuit, and thus a problem arises in the PLL circuit using such a conventional phase comparator circuit in that the two output signals thereof are not output when the two input signals are in-phase. The problem of the conventional phase comparator circuit will be later explained in detail.

SUMMARY OF THE INVENTION

An object of the present invention is to provide a phase comparator circuit comprising two flip-flop circuits and a latch circuit, which outputs a first output signal and a second output signal when a first input signal and a second input signal are in-phase, so that both first and second output signals are not in a high impedance state simultaneously; i.e., a blind sector of the phase comparator circuit is eliminated.

According to the present invention, there is provided a phase comparator circuit for comparing a phase of a first input signal with that of a second input signal and outputting a first output signal and a second output signal in accordance with the result of the comparison. This circuit comprises a first flip-flop circuit, a second flip-flop circuit, and a latch circuit. The first flip-flop circuit receives the first input signal and outputs the first output signal and an inverted signal of the first output signal. The second flip-flop circuit receives the second input signal and outputs the second output signal and an inverted signal of the second output signal. The latch circuit is connected to the first and second flip-flop circuits, and receives the output signals and the inverted output signals of the first and second flip-flop circuits, and applies a reset signal to the first and second flip-flop circuits in accordance with the output signals and the inverted output signals. Therefore, both the first and second output signals are output when the first and second input signals are in-phase.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments, a phase-locked loop (PLL) circuit using a phase comparator circuit, and the problems of the related art, will be first explained.

Figure 1:
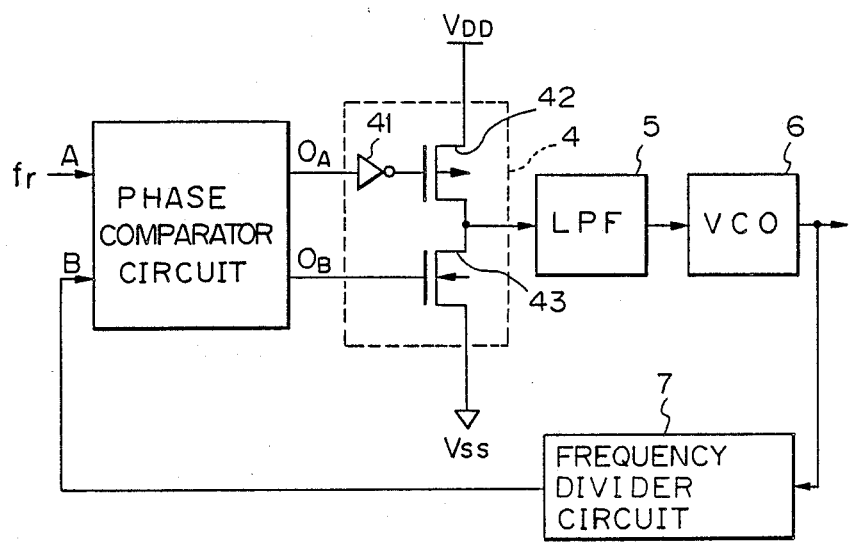
FIG. 1 is a circuit block diagram illustrating a conventional PLL circuit using a phase comparator circuit.

FIG. 1 is a circuit block diagram illustrating a PLL circuit using a phase comparator circuit. As shown in FIG. 1, a reference signal $f_r$ is applied to a phase comparator circuit as a first input signal A of the phase comparator circuit, and a first output signal $O_A$ and a second output signal $O_B$ of the phase comparator circuit are applied to a charge pump circuit 4.

The charge pump circuit 4 comprises an inverter circuit 41, a P-type MOS transistor 42, and an N-type MOS transistor 43. The first output signal $O_A$ is applied to a gate of the transistor 42 via the inverter circuit 41, a high power supply voltage $V_{DD}$ is applied to a drain of the transistor 42, and the second output signal $O_B$ is applied directly to a gate of the transistor 43. A drain of the transistor 43 is connected to a source of the transistor 41 and to a low-pass filter (LPF) 5 as an output of the charge pump circuit 4, and a low power source voltage $V_{SS}$ is applied to a source of the transistor 43.

An output signal of the LPF 5 is applied to a voltage-controlled oscillator (VCO) 6, and an output signal of the VCO 6 is output as an output signal of the PLL circuit. This output signal of the PLL circuit is applied to a frequency divider circuit 7, and an output signal of the frequency divider circuit 7 is applied to the phase comparator circuit as the second input signal B.

In the above PLL circuit, the reference signal $f_r$ applied to the phase comparator circuit as the first input signal A is compared with the output signal of the frequency divider circuit 7 applied to the phase comparator circuit as the second input signal B, and the pulse width of each of the first and second output signals $O_A$, $O_B$ of the phase comparator circuit is changed in accordance with a phase difference between the two input signals A, B. For example, when a phase of the first input signal A leads that of the second input signal B, the output signal of the charge pump circuit 4 is changed at a low level (a negative voltage), and a pulse width of the low level output signal is determined by the value of the phase difference between the two input signals A, B. Conversely, when a phase of the second input signal B leads that of the first input signal A, the output signal of the charge pump circuit 4 is changed at a high level (a positive voltage), and a pulse width of the high level output signal is determined by the value of the phase difference between the two input signals A, B. When a phase of the first input signal A is the same as that of the second input signal B, the first and second output signals $O_A$, $O_B$ of the phase comparator circuit are not output, and thus the output signal of the charge pump circuit 4 is brought to a high impedance state.

Namely, the charge pump circuit 4 outputs high level, low level or high impedance output signals in accordance with the phase difference between the first input signal A and the second input signal B. The output signal of the charge pump 4 is smoothed by the LPF 5 and the direct current ingredient of the charge pump 4 is produced and applied to the VCO 6. An oscillation frequency of the VCO 6 is determined by the direct current ingredient of the output signal of the charge pump 4. The output signal of the VCO 6 is fed back to the phase comparator circuit as the second input signal B through the frequency divider circuit 7, where the output signal of the VCO 6 is divided by a predetermined ratio. Consequently, the second input signal B of the phase comparator circuit is given the same frequency and same phase as the reference signal fr, and the output signal of the VCO 6, which is not divided by the frequency divided circuit 7, is output as the output signal of the PLL circuit.

Figure 2:
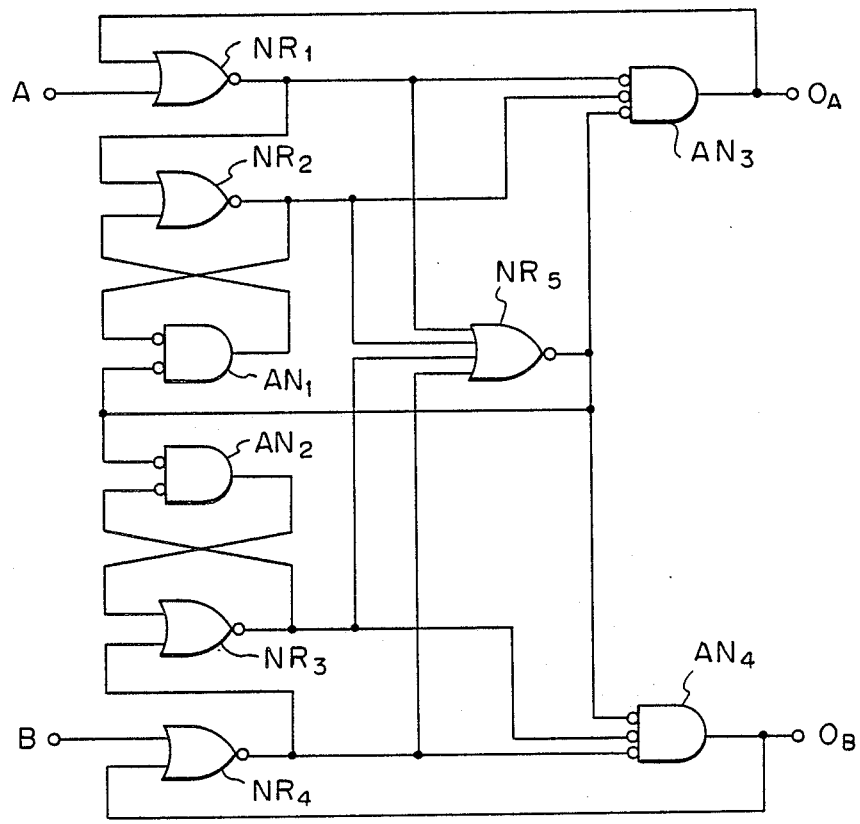
FIG. 2 is a circuit diagram illustrating a conventional phase comparator circuit.

FIG. 2 is a circuit diagram illustrating a conventional phase comparator circuit. The conventional phase comparator circuit shown in FIG. 2 is generally used in, for example, a PLL circuit which comprises five NOR gate circuits $NR_1$-$NR_5$, and four AND gate circuits $AN_1$-$AN_4$ having inverted input terminals. The NOR gate circuit $NR_5$ has four input terminals, and the AND gate circuits $AN_3$, $AN_4$ have three inverted input terminals, respectively. This conventional phase comparator circuit is a typical example of the above described phase comparator circuit. Namely, in this conventional phase comparator circuit, when a phase of the first input signal A is different from that of the second input signal B, the first and second output signals $O_A$, $O_B$ thereof are output by controlling the pulse width of the signals $O_A$, $O_B$ in accordance with the phase difference between the first and second input signals A, B, but when the first input signal A is in-phase with the second input signal B, the first and second output signals $O_A$, $O_B$ are not output.

Figure 3:
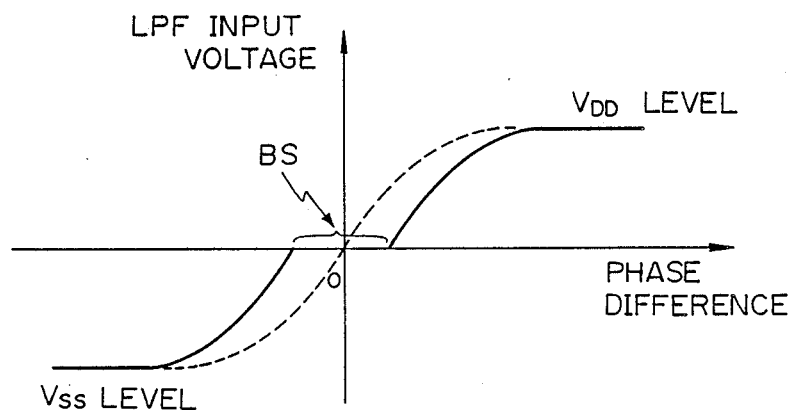
FIG. 3 is a graph illustrating an input signal of a low pass filter (LPF) in a PLL circuit using a conventional phase comparator circuit as shown in FIG. 2.

FIG. 3 is a graph illustrating an input signal of an LPF in a PLL circuit using a conventional phase comparator circuit as shown in FIG. 2.

In FIG. 3, the ordinate indicates an input voltage of the LPF 5, and the abscissa indicates a phase difference between the two input signals A, B. Further, in FIG. 3, a broken line indicates an input signal of the LPF 5 in a PLL circuit using a phase comparator circuit having an ideal characteristic. When there is no phase difference between the input signals A, B, i.e., the two input signals A, B are in-phase, an input signal of the LPF 5 is defined as a high impedance state, and when phase difference between the input signals A, B exists, an input signal of the LPF 5 is changed between a positive voltage and a negative voltage in accordance with the phase difference therebetween. For example, when a phase of the first input signal A leads that of the second input signal B, the input signal of the LPF 5 is changed to a negative voltage in accordance with a phase difference between the two input signals A, B. Conversely, when a phase of the second input signal B leads that of the first input signal A, the input signal of the LPF 5 is a changed to a positive voltage in accordance with a phase difference between the two input signals A, B. When a phase of the first input signal A is same as that of the second input signal B, the input signal of the LPF 5 is at the high impedance state.

Note, in a manufactured phase comparator circuit, the input signal of the LPF 5 may be as shown by a solid line in FIG. 3, due to the dispersions of the elements or parts of the phase comparator circuit.

Namely, in the conventional phase comparator circuit, the two output signals $O_A$, $O_B$ of the phase comparator circuit are not output when the two input signals A, B are in-phase, and consequently, if dispersions of the elements or parts of the phase comparator circuit exist, a boundary between an output of only one signal of the two output signals $O_A$, $O_B$ and an output of only the other of the two output signals $O_A$, $O_B$ is not clear, and a blind sector BS where both output signals $O_A$, $O_B$ of the phase comparator circuit are not output exists.

As described above, in a PLL circuit using such as a conventional phase comparator circuit having the blind sector BS, the precision of an output signal of the PLL circuit is reduced and a waveform thereof is not stable, and therefore, a stable and high quality output signal cannot be produced therefrom.

Figure 4:
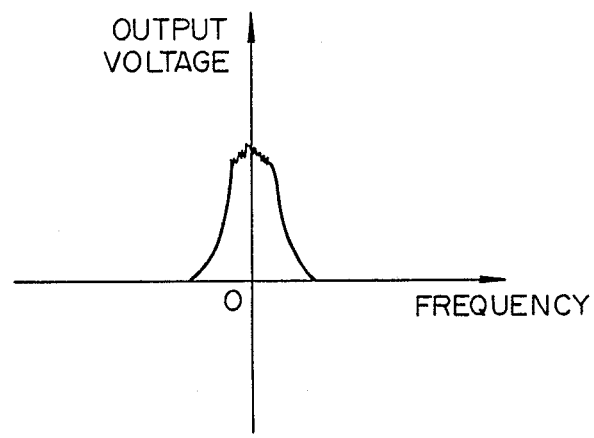
FIG. 4 is a graph illustrating an output signal of a PLL circuit using a conventional phase comparator circuit as shown in FIG. 2 and having a blind sector.

FIG. 4 is a graph illustrating an output signal of a PLL circuit using a conventional phase comparator circuit as shown in FIG. 2, and having a blind sector.

It is obvious from FIG. 4 that the output signal of the PLL circuit using the conventional phase comparator circuit includes a lot of noise corresponding to frequency modulations of the blind sector BS in the conventional phase comparator circuit. Consequently, it is difficult for the PLL circuit using the conventional phase comparator circuit to produce a stable and high quality output signal.

Next, a basic circuit block diagram of the present invention will be described with reference to FIG. 5.

Figure 5:
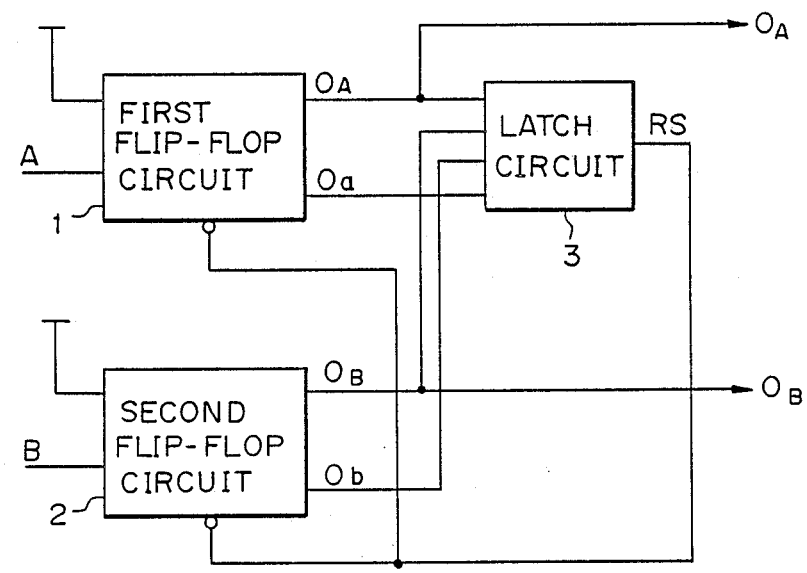
FIG. 5 is a basic circuit block diagram illustrating a phase comparator circuit according to the present invention.

As shown in FIG. 5, a phase comparator circuit comprises a first flip-flop circuit 1, a second flip-flop circuit 2, and a latch circuit 3. The phase comparator circuit compares a phase of a first input signal A with that of a second input signal B, and outputs a first output signal $O_A$ and a second output signal $O_B$ in accordance with the result of the comparison of the two nput signals A, B. The first flip-flop circuit 1 receives the first input signal A and outputs the first output signal $O_A$ and an inverted signal $O_a$ of the first output signal $O_A$. The second flip-flop circuit 2 receives the second input signal B and outputs the second output signal $O_B$ and an inverted signal $O_b$ of the second output signal $O_B$. The latch circuit 3 is connected to the first and second flip-flop circuits 1, 2, and receives the output signals $O_A$, $O_B$ and the inverted output signals $O_a$, $O_b$ of the first and second flip-flop circuits 1, 2 and applies a reset signal RS to the first and second flip-flop circuits 1, 2 in accordance with the output signals $O_A$, $O_B$ and the inverted output signals $O_a$, $O_b$. Therefore, the first and second output signals $O_A$, $O_B$ are output by applying the reset signal RS to the first and second flip-flop circuits 1, 2, when the first and second input signals A, B are in-phase.

Figure 6:
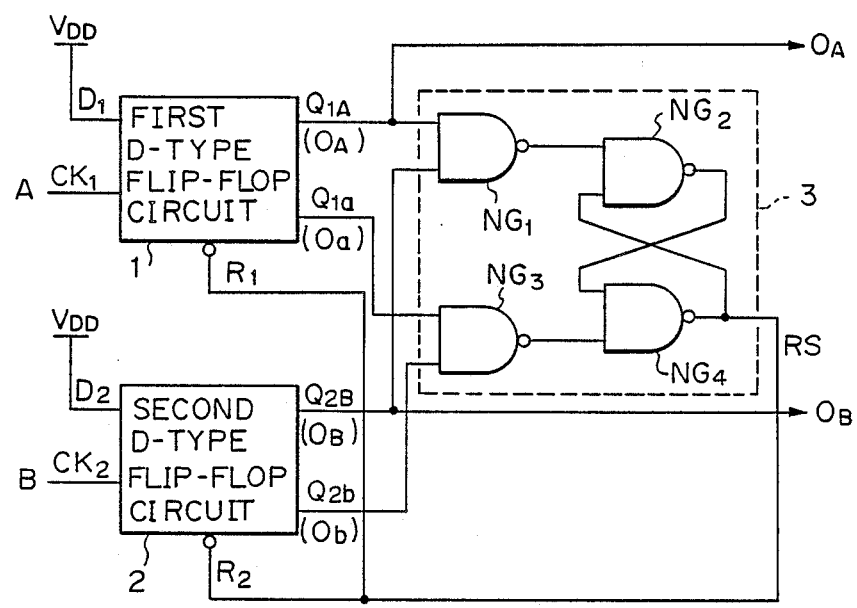
FIG. 6 is a circuit diagram illustrating one example of a phase comparator circuit according to the present invention.

FIG. 6 is a circuit diagram illustrating one example of a phase comparator circuit according to the present invention.

As shown in FIG. 6, this phase comparator circuit embodiment comprises two D-type flip-flop circuits 1, 2 and a latch circuit 3 having first, second, third, and fourth NAND gate circuits $NG_1$, $NG_2$, $NG_3$, $NG_4$. The phase comparator circuit compares a phase of a first input signal A with that of a second input signal B, and outputs a first output signal $O_A$ and a second output signal $O_B$ in accordance with a phase difference between the first input signal A and the second input signal B.

A D-terminal $D_1$ of the first flip-flop circuit 1 is supplied with a power source voltage $V_{DD}$, a clock pulse terminal $CK_1$ thereof is supplied with the first input signal A, and a reset terminal $R_1$ thereof is supplied with a reset signal RS. Similarly, a D-terminal $D_2$ of the second flip-flop circuit 2 is supplied with the power source voltage $V_{DD}$, a clock pulse terminal $CK_2$ thereof is supplied with the second input signal B, and a reset terminal $R_2$ thereof is supplied with the reset signal RS.

One terminal of the first NAND gate circuit $NG_1$ is connected to an output terminal $Q_{1A}$ of the first flip-flop circuit 1, and receives the first output signal $O_A$ of the phase comparator circuit, the other terminal of the first NAND gate circuit $NG_1$ is connected to an output terminal $Q_{2B}$ of the second flip-flop circuit 2, and receives the second output signal $O_B$ of the phase comparator circuit. Further, one terminal of the second NAND gate circuit $NG_2$ is supplied with an output signal of the first NAND gate circuit $NG_1$.

One terminal of the third NAND gate circuit $NG_3$ is connected to an inverted output terminal $Q_{1a}$ of the first flip-flop circuit 1, and the other terminal of the third NAND gate circuit $NG_3$ is connected to an inverted output terminal $Q_{2b}$ of the second flip-flop circuit 2. Note, the inverted output terminal $Q_{1a}$ of the first flip-flop circuit 1 outputs a first inverted output signal $O_a$ which is an inverted signal of the first output signal $O_A$, and the inverted output terminal $Q_{2b}$ of the second flip-flop circuit 2 outputs a second inverted output signal $O_b$ which is an inverted signal of the second output signal $O_B$. Further, one terminal of the fourth NAND gate circuit $NG_4$ is supplied with an output signal of the second NAND gate circuit $NG_2$, and the other terminal of the fourth NAND gate circuit $NG_4$ is supplied with an output signal of the third NAND gate circuit $NG_3$. An output terminal of the fourth NAND gate circuit $NG_4$ is connected to the other input terminal of the second NAND gate circuit $NG_2$, the reset terminal $R_1$ of the first flip-flop circuit 1, and the reset terminal $R_2$ of the second flip-flop circuit 2, so that the first and second flip-flops 1, 2 are supplied with the reset signal RS, which is the output signal of the fourth NAND gate circuit $NG_4$.

Figure 7:
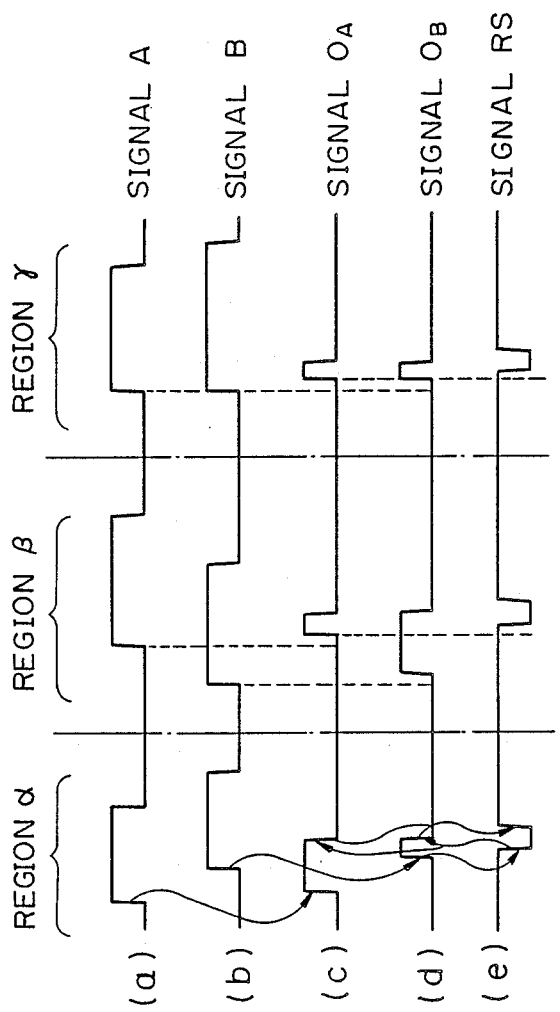
FIG. 7 is a timing chart for explaining the operation of the phase comparator circuit as shown in FIG. 6.

FIG. 7 is a timing chart for explaining the operation of the phase comparator circuit as shown in FIG. 6. In FIG. 7, reference (a) denotes the first input signal A, reference (b) denotes the second input signal B, reference (c) denotes the first output signal $O_A$, reference (d) denotes the second output signal $0_B$ and reference (e) denotes the reset signal RS.

First, as shown in a region $\alpha$ in FIG. 7, when a phase of the first input signal A leads that of the second input signal B, the first input signal A is applied to the clock pulse terminal $CK_1$ of the first flip-flop circuit 1, and the first output signal $O_A$ is delayed by the first flip-flop circuit 1 and output from the output terminal $Q_{1A}$ thereof. Next, the second input signal B is applied to the clock pulse terminal $CK_2$ of the second flip-flop circuit 2, and the second output signal $O_B$ is delayed by the second flip-flop circuit 2 and output from the output terminal $Q_{2B}$ thereof.

Note, in the latch circuit 3, when both first and second output signals $O_A$, $O_B$ are at a low level (both first and second inverted output signals $O_a$, $O_b$ are at a high level), the low level signals $O_A$, $O_B$ are applied to the input terminals of the first NAND gate circuit $NG_1$, respectively, so that the output signal of the first NAND gate circuit $NG_1$ is changed to a high level. Further, the high level signals $O_a$, $O_b$ are applied to the input terminals of the third NAND gate circuit $NG_3$ respectively, so that the output signal of the third NAND gate circuit $NG_3$ is changed to a low level.

When the output signal of the third NAND gate circuit $NG_3$ is at the low level, i.e., an output signal which is the reset signal RS of the fourth NAND gate circuit $NG_4$ is at a high level, regardless of the signal level applied to the one terminal of the fourth NAND gate circuit $NG_4$, when the low level signal is applied to the other terminal of the fourth NAND gate circuit $NG_4$. Further, the two input terminals of the second NAND gate circuit $NG_2$ are supplied with the high level signals, respectively, the output signal of the second NAND gate circuit $NG_2$ is changed to a low level, and the one input terminal of the fourth NAND gate circuit $NG_4$ is supplied with the low level signal, so that the latch circuit 3 is stabilized. Consequently, the reset signal RS is maintained at the high level, and thus the reset terminal $R_1$ of the first flip-flop 1 and the reset terminal $R_2$ of the second flip-flop 2 are supplied with the high level reset signal RS.

When the first output signal $O_A$ rises from the low level to a high level, and the second output signal $0_B$ rises from the low level to a high level after a specific time according to a phase difference between the first and second output signals $O_A$, $O_B$, the reset signal RS changes from the high level to a low level. Namely, when the first output signal $O_A$ applied to one terminal of the first NAND gate circuit $NG_1$ is changed from the low level to the high level and the first inverted output signal $O_a$ applied to one terminal of the third NAND gate circuit $NG_3$ is changed from the high level to the low level, the output signal of the third NAND gate circuit $NG_3$ is changed from the low level to a high level. Furthermore, after a specific time, when the second output signal $O_B$ applied to the other terminal of the first NAND gate circuit $NG_1$ is changed from the low level to the high level and the second inverted output signal $O_b$ applied to the other terminal of the third NAND gate circuit $NG_3$ is changed from the high level to the low level, the output signal of the first NAND gate circuit $NG_1$ is changed from the high level to a low level and the output signal of the second NAND gate circuit $NG_2$ is changed from the low level to a high level, so that the output signal (the reset signal RS) of the fourth NAND gate circuit $NG_4$ is changed from the high level to a low level.

Note, when the reset signal RS is changed from the high level to the low level, i.e., the signals applied to the reset terminal $R_1$ of the first flip-flop circuit 1 and the reset terminal $R_2$ of the second flip-flop circuit 2 are changed from the high level to the low level, both of the first and second flip-flop circuits 1, 2 are reset respectively, the first and second output signals $O_A$, $O_B$ are again changed from the high level to the low level, and the first and second inverted output signals $O_a$, $O_b$ are again changed from the low level to the high level. Further, when the first and second output signals $O_A$, $O_B$ are changed to the low level and the first and second inverted output signals $O_a$, $O_b$ are changed to the high level, the reset signal RS is changed from the low level to the high level as described above.

In the above embodiment of the phase comparator circuit, the output signals $O_A$, $O_B$ are delayed, for example, of a few nanoseconds to dozens of nanoseconds, by the first and second flip-flop circuits 1, 2 and the four NAND gate circuits $NG_1$, $NG_2$, $NG_3$, $NG_4$ of the latch circuit 3. As shown in a region $\beta$ of FIG. 7, when a phase of the second input signal B leads that of the first input signal A, the operation of the phase comparator circuit is the converse of the above described operation when the phase of the first input signal A leads that of the second input signal B. Namely, in the above described operation, when the phase of the first input signal A leads that of the second input signal B, the first output signal $O_A$ can be read to the second output signal $O_B$ and the first inverted output signal $0_a$ can be read to the second output signal $O_b$, when the phase of the second input signal B leads that of the first input signal A.

Next, as shown in a region $\gamma$ of FIG. 7, an operation of the phase comparator circuit when a phase of the first input signal A is the same as that of the second input signal B, i.e., when the first and second input signals A, B are in-phase, will be described below.

First, in the latch circuit 3, when the first and second output signals $O_A$, $O_B$ are at a low level, i.e., when the first and second inverted output signals $O_a$, $O_b$ are at a high level, he reset signal RS is maintained at the high level as described above, and the reset terminal $R_1$ of the first flip-flop 1 and the reset terminal $R_2$ of the second flip-flop 2 are supplied with the high level reset signal RS.

When the first and second output signals $O_A$, $0_B$ applied to the input terminals of the first NAND gate circuit $NG_1$ rise from the low level to the high level at the same time, the output signal of the first NAND gate circuit $NG_1$ is changed from the high level to the low level. Therefore, the signal applied to one terminal of the second NAND gate circuit $NG_2$ is changed from the high level to the low level, so that the output signal of the second NAND gate circuit $NG_2$ is changed from the low level to the high level. Further, when the first and second inverted output signals $O_a$, $O_b$ applied to the input terminals of the third NAND gate circuit $NG_3$ fall from the high level to the low level at the same time, the output signal of the third NAND gate circuit $NG_3$ is changed from the low level to the high level. Consequently, both input terminals of the fourth NAND gate circuit $NG_4$ are supplied with high level signals, respectively, so that the output signal (the reset signal RS) is changed from the high level to the low level.

As described above, when the reset signal RS is changed from the high level to the low level, i.e., the signal applied to the reset terminal $R_1$ of the first flip-flop 1 and the reset terminal $R_2$ of the second flip-flop 2 is changed from the high level to the low level, the first and second flip-flop circuits 1, 2 are reset, and furthermore, the first and second output signals $O_A$, $O_B$ are changed from the high level to the low level, and the first and second inverted output signals $O_a$, $O_b$ are changed from the low level to the high level. When the first and second output signals $O_A$, $O_B$ are at the low level and the first and second inverted output signals $O_a$, $O_b$ are at the high level, the reset signal RS is changed from the low level to the high level.

In the embodiment, both the first output signal $0_A$ and the second output signal $O_B$ are output, respectively, when the first input signal A and the second input signal B are in-phase. Note, the first input signal A and the second input signal B have a pulse width, for example, of a few nanoseconds to dozens of nanoseconds, defined by the delay made in accordance with the delay time of the first and second flip-flop circuits 1, 2 and the four NAND gate circuits $NG_1$, $NG_2$, $NG_3$, $NG_4$ of the latch circuit 3.

Figure 8:
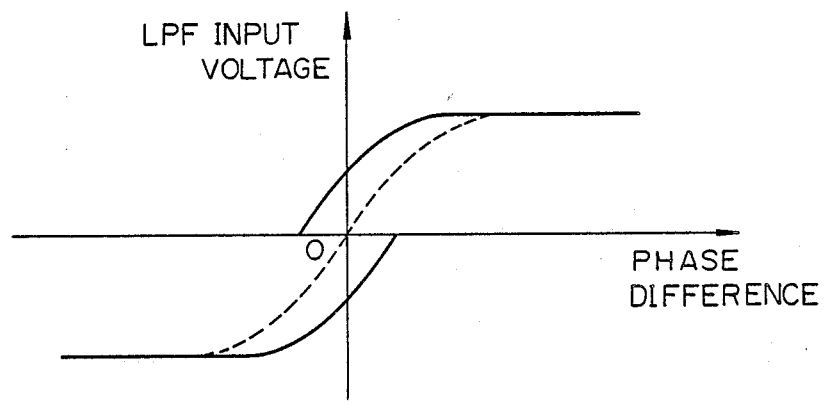
FIG. 8 is a graph illustrating an input signal of an LPF in a PLL circuit using the phase comparator circuit as shown in FIG. 6; and, FIG. 9 is a graph illustrating an output signal of a PLL circuit using the phase comparator circuit as shown in FIG. 6.

FIG. 8 is a graph illustrating an input signal of an LPF in a PLL circuit using the phase comparator circuit as shown in FIG. 6. The ordinate indicates an input voltage of an LPF 5, and the abscissa indicates a phase difference between the two input signals A, B. Further, in FIG. 8, a broken line indicates an input signal of the LPF 5 in the PLL circuit using a phase comparator circuit having an ideal characteristic.

As shown at both sides of the ideal curve of the broken line shown in FIG. 8, of an input signal of the LPF 5 in the PLL circuit using the phase comparator circuit of FIG. 6, a blind sector where both first and second output signals $O_A$, $O_B$ are not output does not exist. Therefore, both the first output signal $O_A$ and the second output signal $O_B$ are output even when the first input signal A and the second input signal B are in-phase, so that the boundary line is clear. Namely, it is possible to perceive when the first input signal A and the second input signal B are in-phase, by comparing the input voltage of the LPF 5 shown by solid lines in FIG. 8.

As described above, in a PLL circuit using the present embodiment phase comparator circuit, the precision of an output signal of the PLL circuit can be increased and a waveform thereof can be stabilized, and furthermore, a high quality output signal can be produced.

Figure 9:
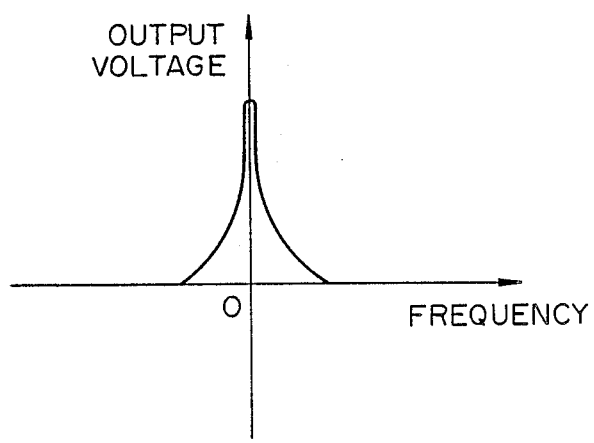

FIG. 9 is a graph illustrating an output signal of a PLL circuit using the phase comparator circuit as shown in FIG. 6. The ordinate indicates an output voltage of a VCO 6, and the abscissa indicates a frequency generated from the PLL circuit.

As shown in FIG. 9, it is obvious that the PLL circuit using the present embodiment phase comparator circuit can produce a high precision, high stability, and high quality output signal.

Many widely different embodiments of the present invention may be constructed without departing from the spirit and scope of the present invention. The phase comparator circuit according to the present invention is not limited to use only for a PLL circuit but can be used for various other circuits.

I claim:

1. A phase comparator circuit for comparing a phase of a first input signal with that of a second input signal and outputting a first output signal and a second output signal in accordance with a result of the comparison, comprising:
   a first flip-flop circuit for receiving said first input signal and outputting said first output signal and an inverted output signal of said first output signal;
   a second flip-flop circuit for receiving said second input signal and outputting said second output signal and an inverted output signal of said second output signal; and a latch circuit, connected to said first and second flip-flop circuits, for receiving said output signals and said inverted output signals of said first and second flip-flop circuits and applying a reset signal to said first and second flip-flop circuits in accordance with said output signals and said inverted output signals;

said first and second output signals being output by applying said reset signal to said first and second flip-flop circuits, when said first and second input signals are in-phase.

2. A phase comparator circuit as claimed in claim 1, wherein said first and second flip-flop circuits are formed by D-type flip-flop circuits respectively, and said latch circuit is formed by a first, a second, a third, and a fourth NAND gate circuits.

3. A phase comparator circuit as claimed in claim 1, wherein said comparator circuit is used in a phase-locked loop circuit.

4. A phase comparator circuit as claimed in claim 1, wherein said phase-locked loop circuit comprises a charge pump circuit, a low-pass filter, a voltage-controlled oscillator and a frequency divider circuit.

5. A phase comparator circuit for comparing a phase of a first input signal with a phase of a second input signal and outputting a first output signal and a second output signal in accordance with a result of the comparison, comprising:

first D-type flip-flop means, having first and second outputs, for receiving said first input signal and for outputting said first output signal via said first output and an inverted output signal of said first output signal via said second output, and including D-terminal means for receiving a power supply voltage, clock pulse terminal means for receiving said first input signal and reset terminal means;

second D-type flip-flop means, having third and fourth outputs, for receiving said second input signal and for outputting said second output signal via said third output and an inverted output signal of said second output signal via said fourth output, and including D-terminal means for receiving a power supply voltage, clock pulse terminal means for receiving said second input signal, and reset terminal means; and latch circuit means, connected to said first and second D-type flip-flop means, for receiving said output signals and said inverted output signals of said first and second D-type flip-flop means and applying a reset signal to said reset terminal means of said first and second D-type flip-flop means in accordance with said output signals and said inverted output signals, comprising:

a first NAND gate circuit having an output, a first input terminal connected to receive said first output signal, and a second input terminal connected to receive said second output signal;

a second NAND gate circuit having an output, a first input terminal operatively connected to the output of said first NAND gate circuit and having a second input terminal;

a third NAND gate circuit having an output, a first input terminal connected to the second output of said first flip-flop means, and a second input terminal connected to the fourth output of said second D-type flip-flop means; and a fourth NAND gate circuit having an output, a first input terminal operatively connected to the output of said second NAND gate circuit, and having a second input terminal operatively connected to the output of said fourth NAND gate circuit to output said reset signal to said second input terminal of said second NAND gate circuit;

said first and second output signals being output by applying said reset signal to said first and second D-type flip-flop means when said first and second input signals are in-phase.

* * * * *